United States Patent [19]

Kumar

[11] Patent Number: 5,426,383
[45] Date of Patent: Jun. 20, 1995

[54] NCMOS - A HIGH PERFORMANCE LOGIC CIRCUIT

[75] Inventor: Rajendra Kumar, Sunnyvale, Calif.

[73] Assignee: Hewlett Packard Company, Palo Alto, Calif.

[21] Appl. No.: 229,861

[22] Filed: Apr. 19, 1994

Related U.S. Application Data

[63] Continuation of Ser. No. 975,491, Nov. 12, 1992, abandoned.

[51] Int. Cl.⁶ .................. H03K 19/0944; H03K 19/00
[52] U.S. Cl. ...................................... 326/119; 326/21; 326/57; 326/83
[58] Field of Search ...................... 307/448, 304, 296.2, 307/360, 443, 451, 473; 326/119, 121, 21, 57, 83; 327/544, 581, 74

[56] References Cited

U.S. PATENT DOCUMENTS

| | | | |
|---|---|---|---|
| 3,641,370 | 2/1972 | Heimbigner | 307/448 |
| 4,386,286 | 5/1983 | Kuo | 307/581 |
| 4,489,246 | 12/1984 | Nishiuchi | 307/448 |
| 4,558,234 | 12/1985 | Suzuki et al. | 307/446 |
| 4,733,108 | 3/1988 | Truong | 307/304 |
| 4,883,978 | 11/1989 | Ohshima et al. | 307/443 |
| 4,956,691 | 9/1990 | Culley et al. | 307/448 |
| 5,038,056 | 8/1991 | Koide et al. | 307/448 |
| 5,059,830 | 10/1991 | Tokumaru | 307/304 |

FOREIGN PATENT DOCUMENTS

0013117A1  7/1980  European Pat. Off. ..... H03K 19/08

OTHER PUBLICATIONS

JP 2-96 428 A in Patents Abstracts of Japan, E-946, Jun. 1990, vol. 14/No. 302.
JP 2-58 422 A in Patents Abstracts of Japan, E-927, May 1990, vol. 14, No. 225.
Shimohigashi et al., "Low Voltage ULSI Dessign", 1992 IEEE Symposium on VLSI Circuits Digest of Technical Papers, Jun. 4–6, 1992, Seattle, Washington, pp. 54–58.

Primary Examiner—David R. Hudspeth
Assistant Examiner—Jon Santamauro

[57] ABSTRACT

A family of high performance logic circuits. Each circuit uses one or more NMOS transistors characterized by controlled threshold voltages. The threshold voltage is determined by changing the doping profile of the gate of that transistor. When each circuit is at its stable state, the current through its controlled-threshold NMOS transistor is limited by a characteristic leakage current of that transistor if its input signal is at a low logic level. The invention is demonstrated in an inverter, a ring-oscillator, an NAND circuit, an NOR circuit, and tri-state logic circuits.

20 Claims, 10 Drawing Sheets

NCMOS - A HIGH PERFORMANCE LOGIC CIRCUIT

CROSS REFERENCE TO RELATED APPLICATION(S)

This is a continuation of application Ser. No. 07/975,491 filed on Nov. 12, 1992, now abandoned.

BACKGROUND OF THE INVENTION

The present invention relates generally to a semiconductor circuit and more particularly to a family of high performance logic circuits.

Progress in computers and digital electronics constantly demands logic circuits that can manipulate digital signals at higher speed, lower signal levels and with less power consumption. Most such logic circuits are formed by combining simple building blocks such as gates and inverters.

Figure 1:
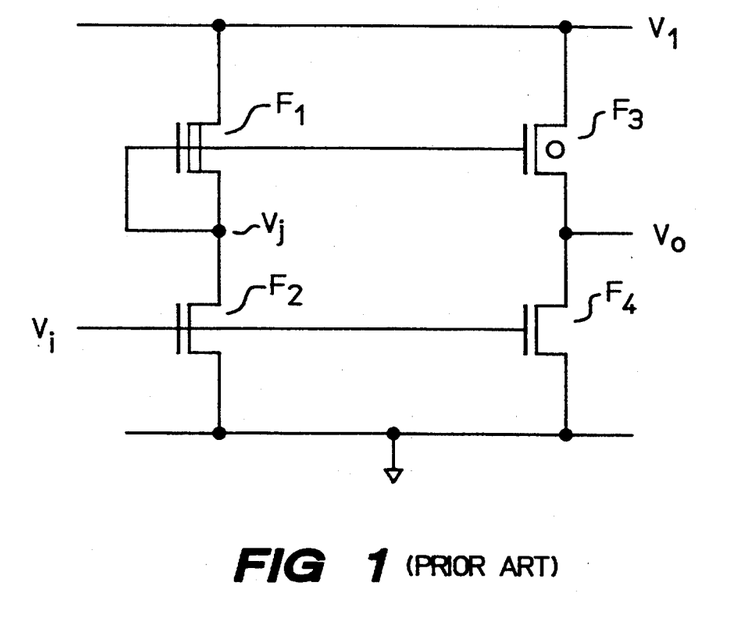
FIG. 1 shows a prior art NMOS inverter.

FIG. 1 shows an inverter that uses NMOS transistors. $F_1$ is a depletion-mode transistor and $F_3$ is a zero-threshold transistor; both are placed in a conducting state by a zero or positive gate voltage. $F_2$ and $F_4$ are enhancement-mode transistors that are placed in a conducting state by a positive gate voltage.

When $V_i$ is at a high logic level, $F_2$ and $F_4$ will be conducting. This couples the ground potential to $V_j$ and $V_o$, placing both $F_1$ and $F_3$ into a conducting state. With all four transistors conducting, significant currents flow through all the transistors. This leads to an undesirable amount of DC power consumption. Moreover, when $V_i$ is at a high logic level, the output voltage $V_o$ should be at the ground potential, but the actual value of $V_o$ depends on the ratio of the drain-to-source resistances through $F_3$ and $F_4$. This type of circuit is known as ratio design circuit.

Figure 2:
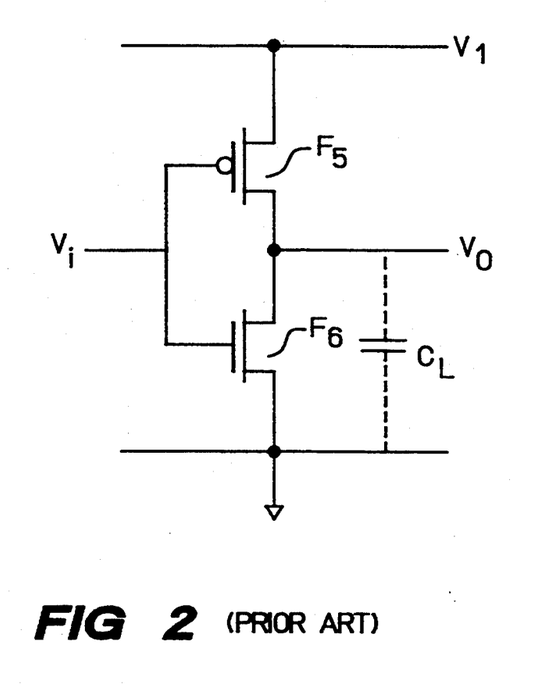
FIG. 2 shows a prior art CMOS inverter.

FIG. 2 depicts a "ratioless" CMOS inverter circuit. When the input voltage $V_i$ is at a steady-state logic level (either high or low), the circuit will be in a stable condition and one of the two output transistors $F_5$ and $F_6$ will be in a non-conducting state. This results in much lower power consumption than in the circuit of FIG. 1. In addition, because one of the output transistors carries no significant current, the output voltage $V_o$ is either equal to zero or $V_1$ depending on whether the input is high or low, respectively. Thus the output voltage swings all the way between the minimum and maximum power supply voltage. A drawback of the circuit is that it is relatively slow because the switching speed of the PMOS output transistor $F_5$ is two or three times slower than the speed of the corresponding NMOS output transistor $F_3$ in FIG. 1.

Figure 3:
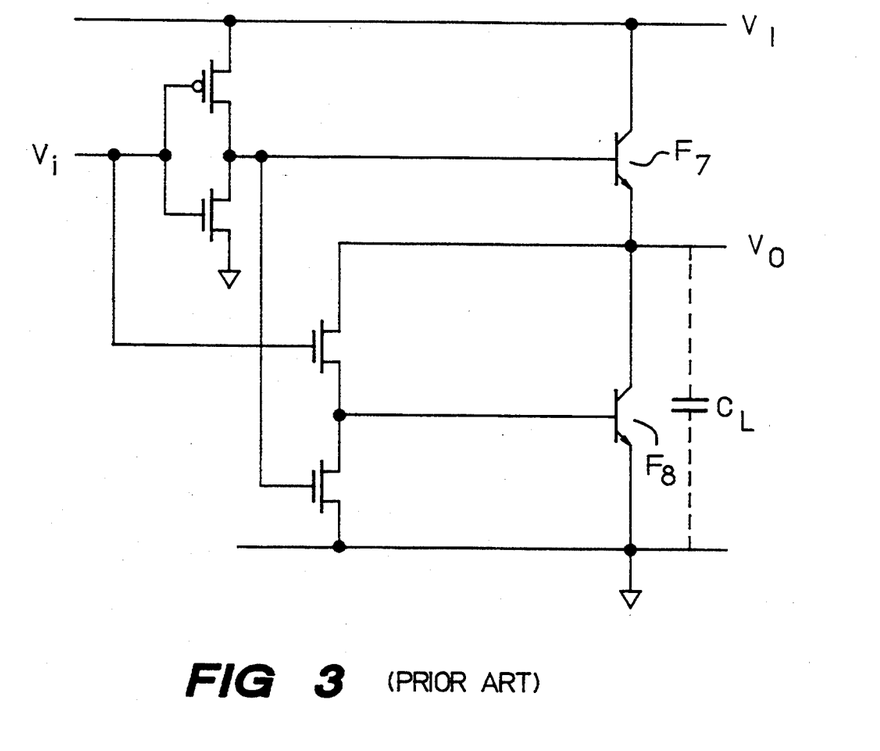
FIG. 3 shows a prior art BiCMOS inverter.

FIG. 3 shows a BiCMOS inverter in which the MOS pull-up and pull-down transistors $F_5$ and $F_6$ in FIG. 2 have been replaced with bipolar transistors $F_7$ and $F_8$. The logic levels of the circuit are still controlled by MOS transistors. Similar to the circuit in FIG. 2, only leakage current flows through the bipolar transistors when the inverter is in a stable condition. However, the bipolar transistors have greater current-handling capacity than the MOS output transistors and therefore they usually provide much faster switching speed when driving a capacitive load $C_L$.

A drawback of the BiCMOS circuit is that the output voltage cannot swing all the way between the minimum and maximum power supply voltage. This is because a bipolar transistor has a minimum forward-bias diode-voltage drop that is determined by the material of the transistor; for silicon transistors, this forward voltage drop is about 0.7 volts. Thus, in the inverter circuit of FIG. 3, a low input voltage results in an output voltage of $(V_1 - 0.7)$ rather than $V_1$, and a high input voltage results in an output voltage of 0.7 volts rather than zero.

Figure 4:
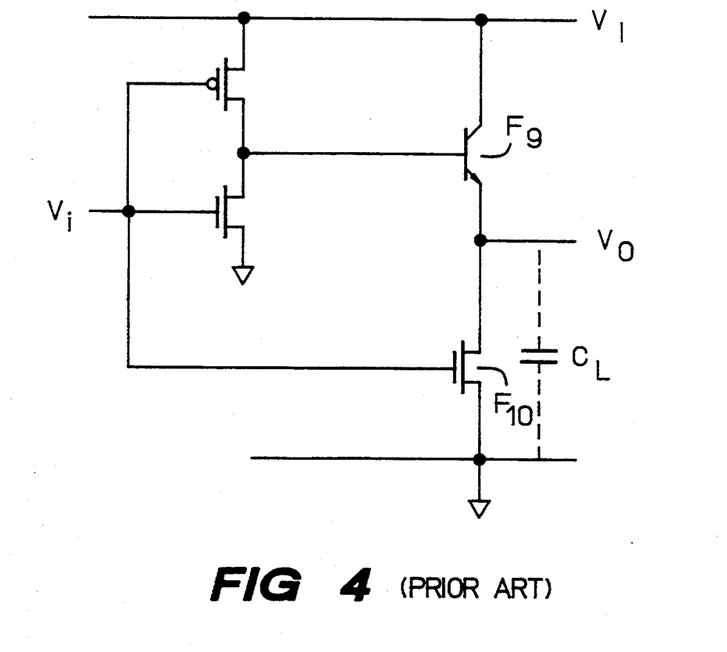
FIG. 4 shows a prior art BiNMOS inverter.

FIG. 4 shows a BiNMOS inverter circuit that is similar to the circuit shown in FIG. 3 except that the bipolar pull-down transistor $F_8$ has been replaced with an NMOS transistor $F_{10}$. The NMOS transistor does not have a forward-bias diode-voltage drop. Thus, in the circuit of FIG. 4 the output can go to zero with a "high" input. But, it still cannot go to a higher level than $(V_1 - 0.7)$ with a "low" input.

The trend in modern circuit design, especially for hand-held and other battery-powered devices, is toward lower supply voltages. Because of the forward-bias diode-voltage drop that is inherent in a bipolar transistor, the circuits of FIGS. 3 and 4 cannot be scaled with the supply voltage. As the supply voltage decreases, the forward-bias diode-voltage drop becomes a larger percentage of the supply voltage. This reduces the relative range of the output voltage of the circuit and results in a correspondingly increased susceptibility to noise.

In addition, bipolar transistors are subject to saturation, which slows down the circuit. Also, the process technology required to manufacture a BiCMOS or BiNMOS circuit is more complex than that required to manufacture an MOS circuit; for example, at least four additional masks are required.

From the foregoing it will be apparent that there is a need for a logic circuit that offers the switching speed of bipolar transistors but that avoids the drawbacks of reduced voltage swing, manufacturing complexity, and slow recovery from inadvertent saturation.

SUMMARY OF THE INVENTION

The present invention provides a family of new high performance logic circuits, known as NCMOS logic circuits. They are not only faster than CMOS circuits, but also easier and cheaper to fabricate, and more reliable than BiCMOS and BiNMOS circuits. They provide the similar advantage of low power consumption as BiCMOS and BiNMOS circuits, but they do not have a constant forward-bias diode-voltage drop at their outputs, so they can be scaled to match a change in the value of the supply voltage.

In a first embodiment, a first NMOS transistor characterized by a controlled threshold voltage is connected to a second NMOS transistor. The first NMOS transistor responds to a first signal to establish a low-resistance current path between a first power terminal and a circuit output if the first signal assumes a high logic level. If the first signal assumes a low logic level, the current path becomes high-resistance.

The second NMOS transistor responds to a second signal to establish a low-resistance current path between a second power terminal and the circuit output if the second signal assumes the high logic level. If the second signal assumes the low logic level, the current path becomes high-resistance.

The circuit establishes a low-resistance current path either between the circuit output and the first power terminal or between the circuit output and the second power terminal by setting the first signal at the high logic level when the second signal is at the low logic level and vice versa.

Any current flowing through the high-resistance current path established by each transistor does not exceed a characteristic leakage current of that transistor.

Another preferred embodiment of the invention is that the second NMOS transistor is also characterized by a controlled threshold voltage. This further increases the switching speed of the circuit.

By incorporating additional transistors, different preferred embodiments of NCMOS circuits are generated. These include NCMOS inverters, oscillators, NAND logic circuits, NOR logic circuits and tri-state logic circuits.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

The present invention provides a family of new high performance logic circuits, known as NCMOS logic circuits. They provide ratioless logic circuits with power consumption similar to CMOS circuits, but with switching speed comparable to BiNMOS and BiCMOS circuits. The invented circuits can also be scaled, are easier and cheaper to build, and more reliable than BiCMOS and BiNMOS circuits.

The present invention replaces the bipolar transistors at the outputs of BiNMOS and BiCMOS circuits with NMOS transistors characterized by controlled threshold voltages.

A controlled-threshold NMOS transistor is a type of NMOS transistor with its threshold voltage controlled to a specific value for specific needs. A threshold voltage is the voltage required to put the transistor in a conductive state. It is defined as that gate to source voltage below which only leakage current flows.

The following expression represents the drain current $I_d$ of an NMOS transistor:

$$I_d \propto (\mu^*(W/L)^*(V_{gs}-V_t)^2), \quad (1)$$

where $\mu$ = the mobility of the carriers of the transistor;
W = the width of the gate of the transistor;
L = the length of the gate of the transistor;
$V_{gs}$ = the gate to source voltage of the transistor; and
$V_t$ = the threshold voltage of the transistor.

The threshold voltage of the transistor is controlled by the doping profile of its gate-channel. If the source of the transistor is not grounded, the threshold voltage is also affected by the voltage applied to the source. This is known as the body effect of a field effect transistor.

Figure 5A:
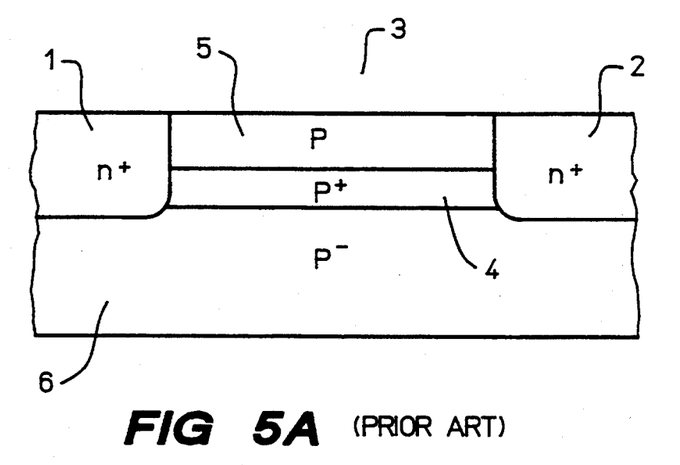
FIGS. 5A-B show cross sections of two MOS transistors.

FIG. 5A shows a cross section of an NMOS transistor on a P− substrate 6 with n+ regions 1 and 2 serving as the source and the drain respectively. A gate-channel 3 is formed by two implantations: one with a deep-threshold implant to generate a p+ region 4 for reducing the possibility of punch-through, and the other a shallow-threshold implant to generate a p region 5. Both the gate-channel implant and the body effect determine the threshold voltage. In a typical NMOS transistor, the threshold voltage with body effect can be as high as 1 to 1.5 volts.

Figure 5B:
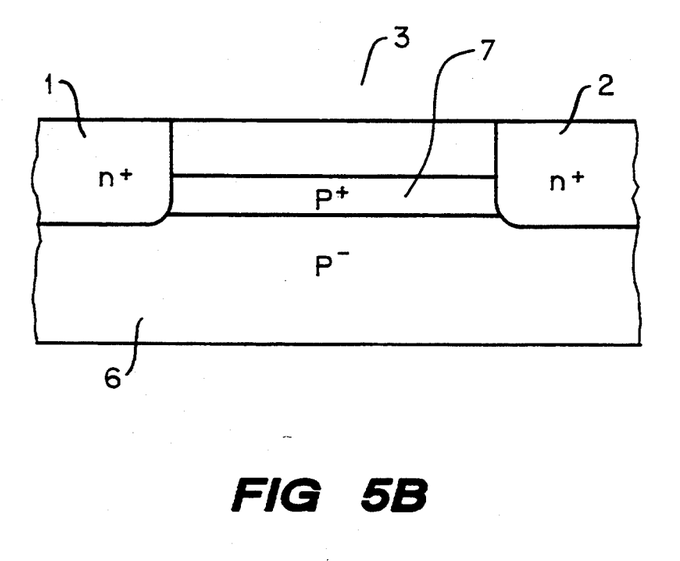

FIG. 5B shows a cross section of a controlled-threshold NMOS transistor. Components in FIG. 5B similar to components in FIG. 5A are assigned the same numerals. The gate-channel 3 in FIG. 5B is formed by one implantation to generate the P+ region 7. By controlling the doping concentration and drive-in time of the p+ dopant, the threshold voltage of the transistor is controlled to a specific value.

Figure 6:
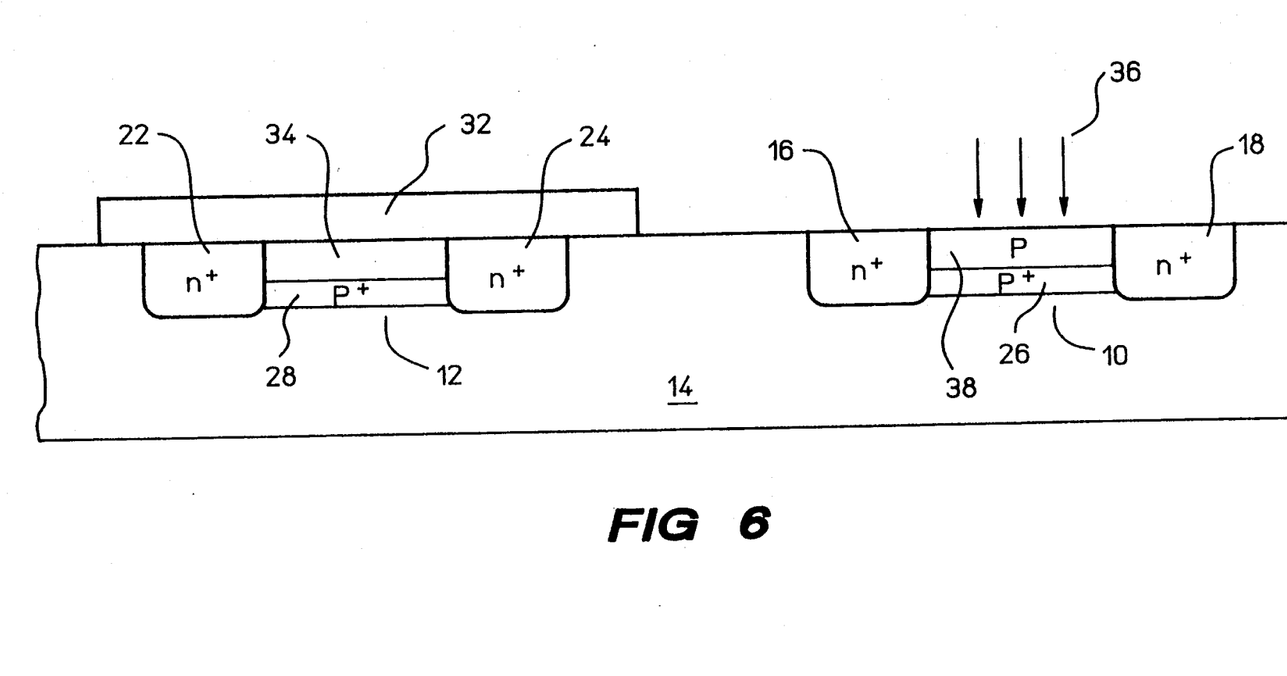
FIG. 6 shows a fabrication step of two NMOS transistors.

FIG. 6 illustrates one step in fabricating a first 12 and a second NMOS transistor 10; the first NMOS transistor 12 is a controlled-threshold NMOS transistor. Both transistors are being fabricated in a single substrate 14. Source and drain regions 22 and 24 of the first transistor 12, source and drain regions 16 and 18 of the second transistor 10, and deep threshold implants 26, 28 for both transistors have already been formed in the substrate 14. A mask 32 is applied over a gate channel 34, and a second shallow implantation is performed, as indicated by arrows 36, to produce a P channel 38 over the P+ channel 26 of the transistor 10. As shown by the illustrated step, if only the first NMOS transistor is required, both the masking and the shallow implantation steps can be omitted.

Figure 7:
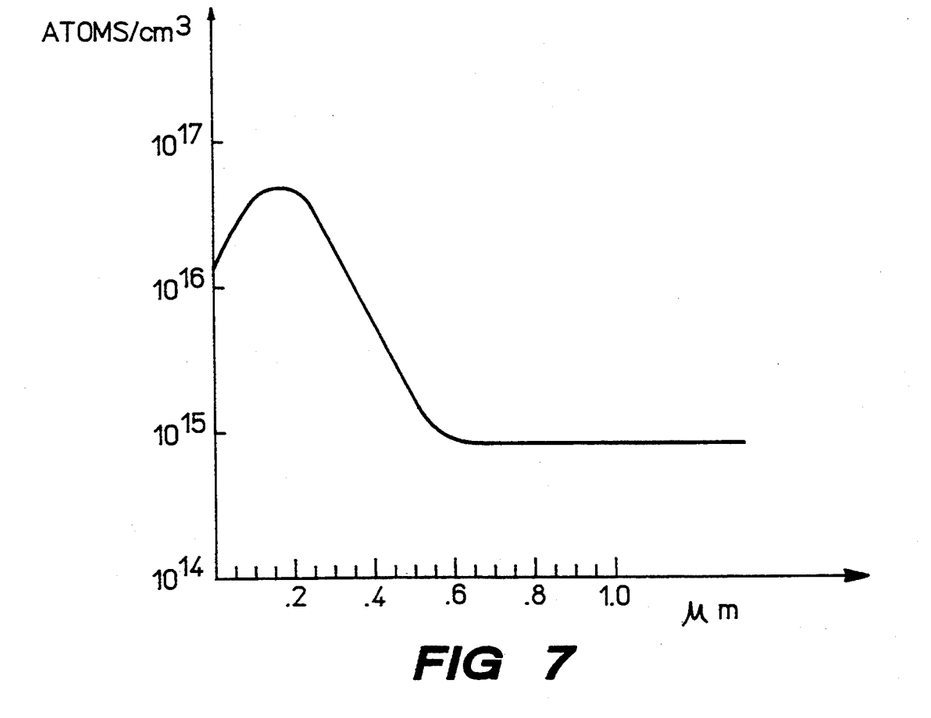
FIG. 7 shows the doping profile of a controlled-threshold NMOS transistor used in the first embodiment of the invention.

FIG. 7 shows one example of a doping profile used to fabricate a controlled-threshold NMOS transistor. The y-axis denotes the doping concentration in log scale with the unit of atoms/cm$^3$. The x-axis denotes the distance from the surface of the semiconductor where the dopants are located. Such a profile gives a $V_t$ of about 0.2 volts. By controlling the doping profile, the threshold voltage can be scaled from 0 volt to 1.5 volts or more.

Similar to BiNMOS and CMOS transistors, the power dissipation of a transistor with the doping profile shown in FIG. 7 is low. The leakage current for such a transistor with a 0.8 microns gate-channel length is about 10 nA per micron of gate-channel width. If the channel width is 50 microns, and the output voltage swing (the change in the output voltage when the output goes from a high to a low logic level) is 3 volts, then the DC power consumption is calculated as follows:

$$10nA/\mu m * 50 \ \mu m * 3 \ V = 1.5 \ \mu W.$$

The AC power consumed by such a transistor is defined as $$C_L V^2 f$$

where
CL=the load capacitance;
V=the output voltage swing; and
f=the frequency of operation.

If the transistor is running at 100 Megahertz, with a load capacitance of 0.5 pf, then the AC power consumed is 0.45 mW. So, the DC power is only 0.3% of the AC power consumed by the transistor.

One embodiment of a controlled-threshold NMOS transistor has a gate-channel length of 0.8 microns, width of 50 microns and the doping profile as shown in FIG. 7. The numerical results in this disclosure are based on SPICE simulations of a PISCES model of such a transistor.

Figure 8:
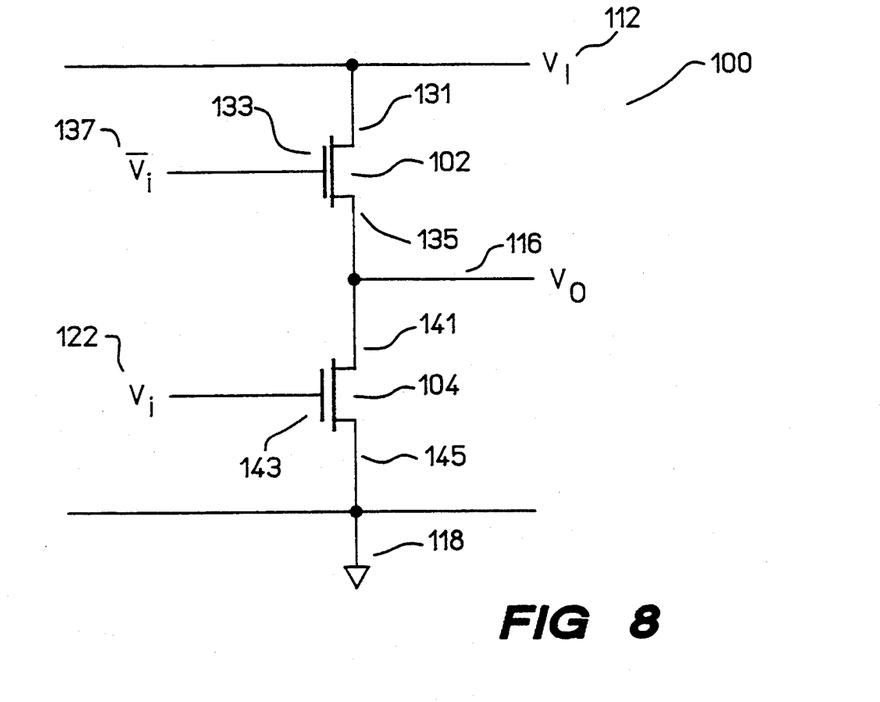
FIG. 8 shows the first embodiment of the invention.

FIG. 8 illustrates the first preferred embodiment of the invention. The NCMOS circuit 100 has a first NMOS transistor 102 which is a controlled-threshold NMOS transistor, and a second NMOS transistor 104.

The first NMOS transistor 102 has a drain 131, a gate 133 and a source 135. The transistor is schematically represented by two gate bars close to each other. The drain 131 is connected to a first power terminal 112, which provides the supply voltage for the circuit. The gate 133 receives a first signal 137. The source 135 is connected to an output 116 of the circuit 100. If the first signal 137 assumes a high logic level, then the transistor 102 establishes a low-resistance current path between the first power terminal 112 and the circuit output 116; if the first signal 137 assumes a low logic level, then the transistor 102 establishes a high-resistance current path between the first power terminal 112 and the circuit output 116.

The second NMOS transistor 104 has a drain 141, a gate 143 and a source 145. The drain 141 is connected to the output 116 of the circuit 100. The gate 143 receives a second signal 122, and the source 145 is connected to a second power terminal 118 which is at a ground potential. If the second signal 122 assumes the high logic level, then the NMOS transistor 104 establishes a low-resistance current path between the second power terminal 118 and the circuit output 116; if the second signal 122 assumes the low logic level, then the NMOS transistor 104 establishes a high-resistance current path between the second power terminal 118 and the circuit output 116.

The circuit 100 operates in such a way that when the first signal 137 is at the high logic level, the second signal 122 is at the low logic level and when the first signal 137 is at the low logic level, the second signal 122 is at the high logic level. Such operation establishes a low-resistance current path either between the circuit output 116 and the first power terminal 112 or between the circuit output 116 and the second power terminal 118.

Also, the current flowing in the high resistance current path established by each transistor does not exceed the characteristic leakage current of that transistor. As discussed previously, this characteristic leakage current is primarily a function of the physical dimensions and the doping profile of the gate channel of the transistor and is typically on the order of a few hundred nanoamperes.

A circuit that is based on MOS transistors can typically be fabricated with four or five fewer mask levels than a circuit that includes both MOS and bipolar transistors; this in turn reduces the cost and the manufacturing time, and increases the reliability of the circuit.

Figure 9:
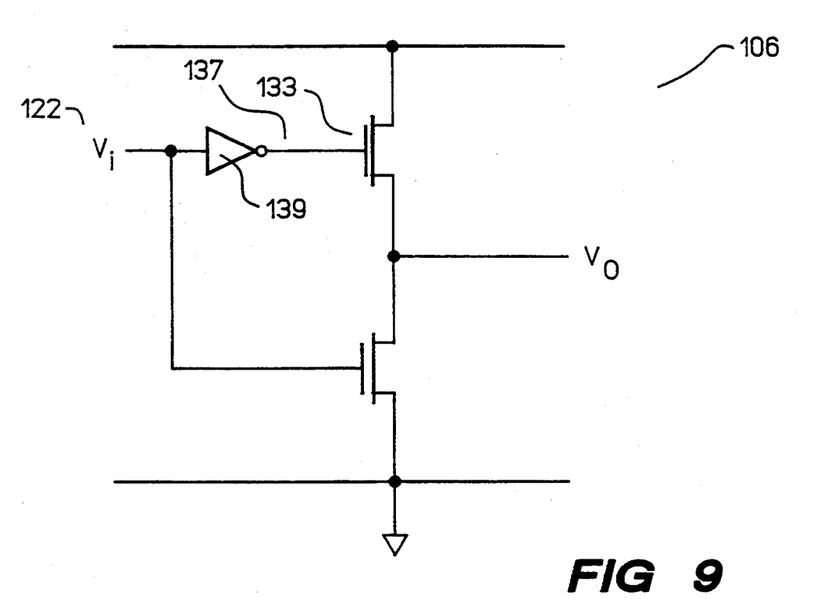
FIG. 9 illustrates an NCMOS inverter according to the invention.

FIG. 9 shows an NCMOS inverter circuit 106. It combines the first embodiment with an inverter 139, which is preferably a CMOS device. The inverter 139 receives the first signal 122 and provides the second signal 137, which is the complement of the first signal 122.

Figure 10A:
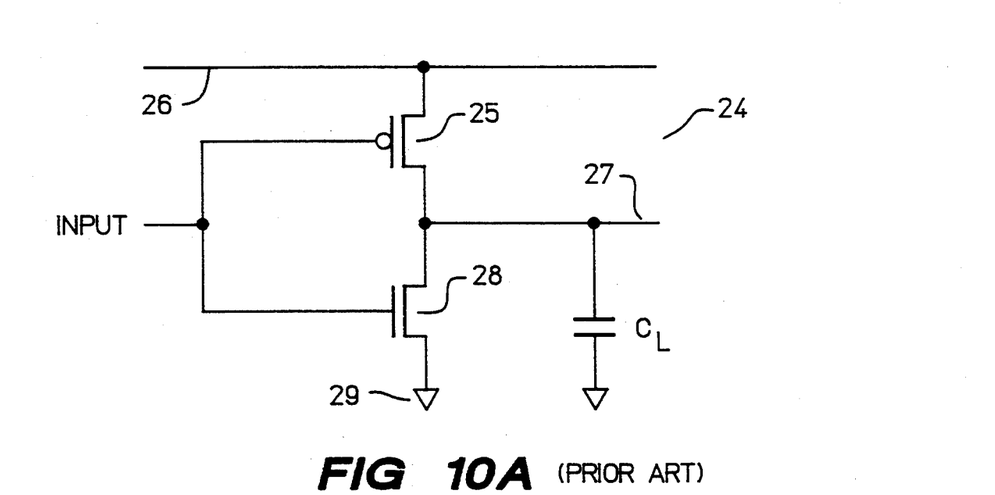
FIGS. 10A-C illustrate a prior art CMOS inverter, a prior art BiNMOS inverter and an NCMOS inverter according to the invention.
Figure 10B:
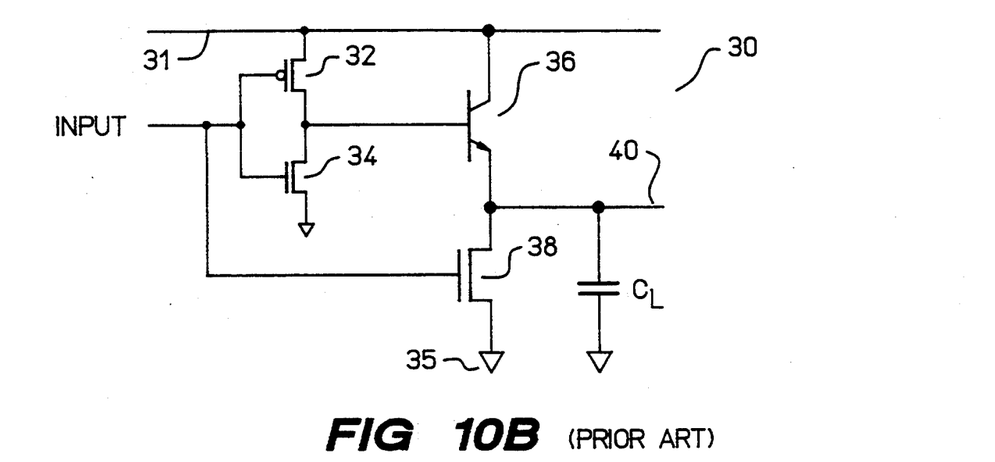
Figure 10C:
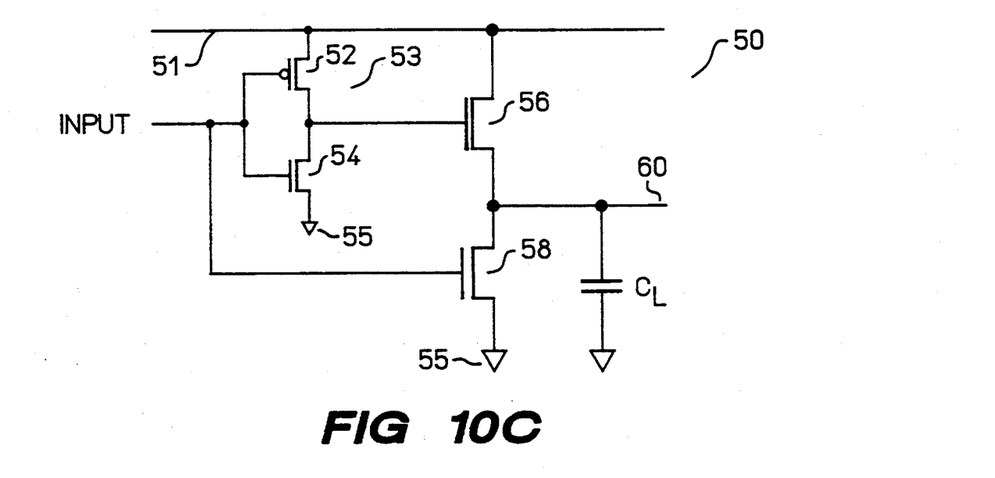

The propagation gate delay of the NCMOS inverter is compared with those of a CMOS and a BiNMOS inverter. FIGS. 10A, 10B and 10C depict various inverter circuits. FIG. 10A shows a prior art CMOS inverter circuit 24 in which a PMOS transistor 25 connects between a positive power terminal 26 and an output 27, and an NMOS transistor 28 connects between the output 27 and a ground terminal 29. The PMOS transistor 25 has a gate channel that is typically on the order of 33 microns wide and 0.6 microns long. The NMOS transistor 28 has a gate channel that is typically on the order of 15 microns wide and 0.6 microns long.

FIG. 10B shows a prior art BiNMOS inverter circuit 30 with a bipolar transistor 36, an output NMOS transistor 38 and a CMOS inverter which is a PMOS transistor 32 connected to an NMOS transistor 34. The CMOS inverter connects between a positive power terminal 31 and a ground terminal 35. The output of the CMOS inverter is connected to the base of the bipolar transistor 36, and the input of the CMOS inverter is connected to the gate of the output NMOS transistor 38. The bipolar transistor 36 is connected between the positive power terminal 31 and a circuit output 40, and the output NMOS transistor 38 is connected between the circuit output 40 and the ground terminal 35. The PMOS transistor 32 has a gate channel that is typically on the order of 20 microns wide and 0.6 microns long. The NMOS transistor 34 has a gate channel that is typically on the order of 8 microns wide and 0.6 microns long. The bipolar transistor has an emitter that is typically on the order of 8 microns wide and 0.6 microns long. The output NMOS transistor 38 has a gate channel that is typically on the order of 20 microns wide and 0.6 microns long.

FIG. 10C shows an NCMOS inverter circuit 50 according to the invention with a CMOS inverter 53, a first NMOS transistor 56 which is a controlled-threshold NMOS transistor and a second NMOS transistor 58. The CMOS inverter 53, with its PMOS transistor 52 and NMOS transistor 54, connects between a positive power terminal 51 and a ground terminal 55. The output of the CMOS inverter 53 is connected to the gate of the first NMOS transistor 56, and the input of the CMOS inverter 53 is connected to the gate of the second NMOS transistor 58. The first NMOS transistor 56 is connected between the positive power terminal 51 and a circuit output 60, and the second NMOS transistor 58 is connected between the circuit output 60 and the ground terminal 55. The PMOS transistor 52 has a gate channel that is typically on the order of 20 microns wide and 0.6 microns long. The NMOS transistor 54 of the CMOS inverter 53 has a gate channel that is typically on the order of 8 microns wide and 0.6 microns long. The first NMOS transistor 56 has a gate channel that is typically on the order of 50 microns wide and 0.8 microns long. The second NMOS transistor 58 has a gate channel that is typically on the order of 20 microns wide and 0.6 microns long.

The gate delay of each circuit depends significantly on the capacitances at its input and its load capacitance. The capacitance at the input is approximately equal to the sum of the input capacitances of the MOS transistors connected to the input. The MOS transistors not connected to the input terminal are of secondary effect. For example, increasing the width of the gate of the controlled-threshold NMOS transistor 56 in FIG. 10C increases the input capacitance of that transistor, but the input capacitance of the circuit 50 does not increase proportionally. However, referring back to expression 1, the maximum output current of the transistor increases proportionally with the gate width.

In order to compare the gate delay of the three circuits in FIGS. 10A–C, they are provided with equal load capacitance $C_L$ and approximately equal total input capacitance. The input capacitance is approximately proportional to the sum of the widths of all the gates connected to the input. In all three circuits, this sum is 48 microns.

Table 1 shows the simulated results of the worst-case gate-delay of each of the circuits as a function of the load capacitance.

TABLE 1

| $C_L$, Pf | Circuit | Delay Lo-to-Hi, ps | Delay Hi-to-Lo, ps | Average Delay, ps | % Speedup |
|---|---|---|---|---|---|
| 0.3 | BiNMOS | 184 | 94 | 139 | 38.5 |
|  | NCMOS | 220 | 118 | 169 | 25.2 |
|  | CMOS | 228 | 224 | 226 | 0 |
| 0.5 | BiNMOS | 217 | 142 | 179.5 | 45.4 |
|  | NCMOS | 258 | 174 | 216 | 34.4 |
|  | CMOS | 335 | 323 | 329 | 0 |
| 1.0 | BiNMOS | 289 | 270 | 279.5 | 51.9 |
|  | NCMOS | 350 | 309 | 329.5 | 43.3 |
|  | CMOS | 602 | 560 | 581 | 0 |

The gate-delay of a circuit is defined as the time for a signal to propagate from its input to its output. The time is typically measured between the input and the output waveform and is recorded when each of the waveforms reaches 50% of its final value. Delay Lo-to-Hi denotes the gate-delay in pico-seconds when the output goes from low to high. Delay Hi-to-Lo denotes the gate-delay when the output goes from high to low. Average Delay, AD, denotes the average of above two delays. The supply voltage is at 3.6 V, and the temperature is at 85° C. The % speedup is the speedup over the CMOS inverter 24 and is calculated as follows:

$$\% \text{ speedup} = [AD(CMOS) - AD]/AD(CMOS) \quad (2).$$

As shown in Table 1, the BiNMOS 30 and the NCMOS 50 inverter are much faster than the CMOS inverter 24. If the load capacitance is low, such as 0.3 pf, the intrinsic gate delay of the circuit is more dominant, and the BiNMOS inverter 30 is faster than the NCMOS inverter 50. As the load capacitance becomes larger, the delay due to the current charging the load capacitance dominates, and the switching speed of the NCMOS inverter 50 becomes similar to that of the BiNMOS inverter 30.

NCMOS circuits are typically not used for driving very small load capacitance or circuits with just one fan-out (fan-out is the number of gates driven by a signal). As shown in Table 1, with a high load capacitance, the BiNMOS and the NCMOS inverter have similar speed advantage over the CMOS circuit; however, the NCMOS inverter can be scaled to accommodate lower supply voltage, and provides the benefits of lower cost and higher reliability than the BiNMOS inverter.

A controlled-threshold NMOS transistor occupies a larger area on a chip than a bipolar transistor with similar drain current. So the NCMOS inverter 50 occupies about 50% more area than the BiNMOS inverter 30. In most cases, the impact of this increase in area is minimal because chip area is used up mostly by on-chip caches, buses and I/O.

Another way to compare the speedups of an NCMOS circuit and a BiNMOS circuit over a CMOS circuit is by building a ring oscillator using each type of inverter and measuring its period of oscillation.

Figure 11:
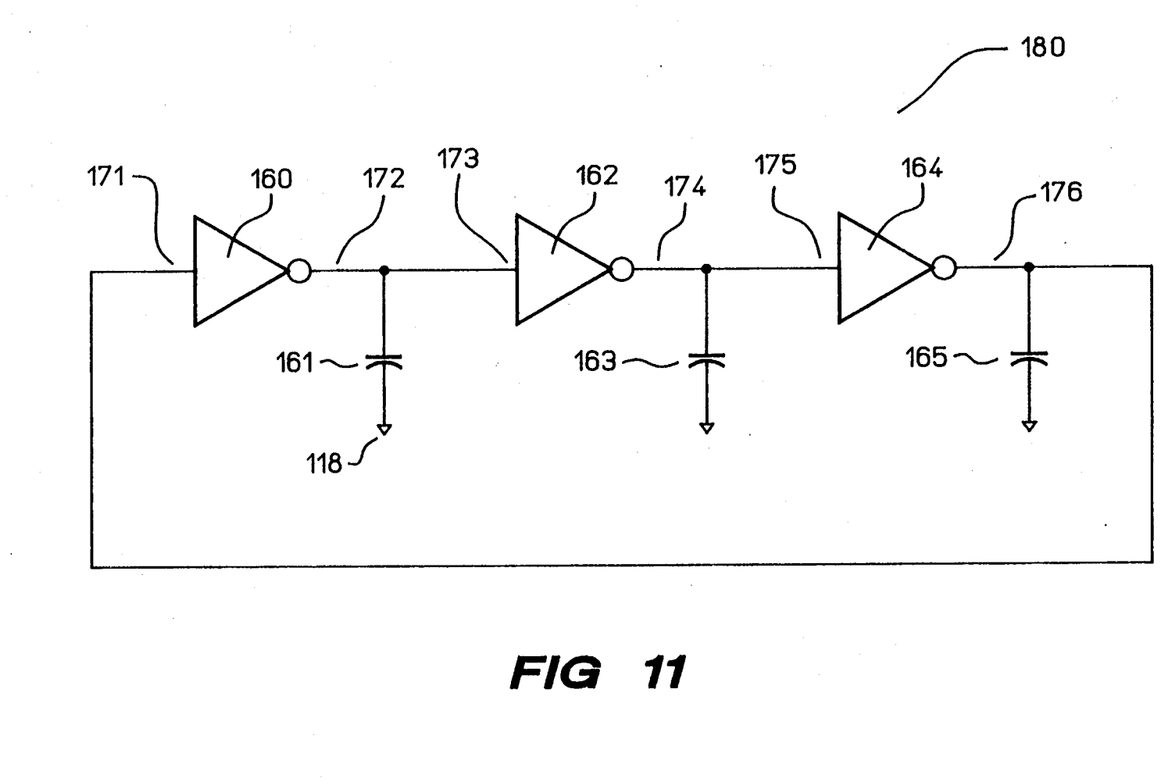
FIG. 11 shows an NCMOS ring oscillator embodying the invention.

A ring oscillator circuit 180 including three inverter circuits 160, 162 and 164 is shown in FIG. 11. The three inverter circuits are connected in a serial ring. A capacitor is connected between the output of each circuit and a common return; for example, the capacitor 161 is connected between the output of the inverter circuit 160 and the common return 118. The common return 118 can be the ground terminal or the positive power terminal of the inverter circuits. Typically, all the capacitors are of the same value, for example 0.5 pF.

The speeds of the three types of circuits, NCMOS, BiNMOS and CMOS, are compared using the ring oscillator circuit. All three inverters in the oscillator circuit 180 are of the same type. Each inverter circuit may be an NCMOS circuit embodying the invention, for example the circuit shown in FIG. 10C, or an inverter circuit according to the prior art as shown in FIGS. 10A and 10B. Table 2 tabulates the period of oscillation of each type.

TABLE 2

| Circuit | Period of Oscillation, ns | % Speedup |
|---|---|---|
| BiNMOS | 1.52 | 47.9 |
| NCMOS | 1.82 | 37.7 |
| CMOS | 2.92 | 0 |

The % speedup column is again defined by equation 2, but with the gate-delay replaced by the period of oscillation. As the magnitude of the capacitors increases, the % speedup of the NCMOS oscillator becomes comparable to the BiNMOS oscillator.

Although the oscillator circuit 180 consists of three inverters, any odd number of inverters can be used to generate the oscillator circuit. Also, the capacitors in the oscillator circuit 180 can be parasitic capacitors.

Referring again to FIG. 8, in another preferred embodiment of the invention, the pull-down transistor 104 as well as the pull-up transistor 102 is fabricated with a doping profile such as that shown in FIG. 7. Thus, both transistors are characterized by controlled threshold voltages. As illustrated in FIG. 6, such configuration can reduce one masking and one implantation step. Moreover, the speed of the circuit is further improved. For example, this embodiment may be embodied in an NCMOS inverter circuit of the kind illustrated in FIG. C. The gate dimensions are 50 microns wide by 0.8 microns long for the pull-up transistor 56, and 20 microns wide by 0.8 microns long for the pull-down transistor 58. Table 3 compares the performance of this circuit with the prior art circuits shown in FIGS. 10A and 10B.

TABLE 3

| $C_L$, Pf | Circuit | Delay Lo-to-Hi, ps | Delay Hi-to-Lo, ps | Average Delay, ps | % Speedup |
|---|---|---|---|---|---|
| 0.3 | BiNMOS | 184 | 94 | 139 | 38.5 |
|  | NCMOS | 220 | 69 | 144.5 | 36.0 |
|  | CMOS | 228 | 224 | 226 | 0 |
| 0.5 | BiNMOS | 217 | 142 | 179.5 | 45.4 |
|  | NCMOS | 258 | 97 | 177.5 | 46.0 |
|  | CMOS | 335 | 323 | 329 | 0 |
| 1.0 | BiNMOS | 289 | 270 | 279.5 | 51.9 |
|  | NCMOS | 349 | 171 | 260 | 55.3 |
|  | CMOS | 602 | 560 | 581 | 0 |

Figure 12:
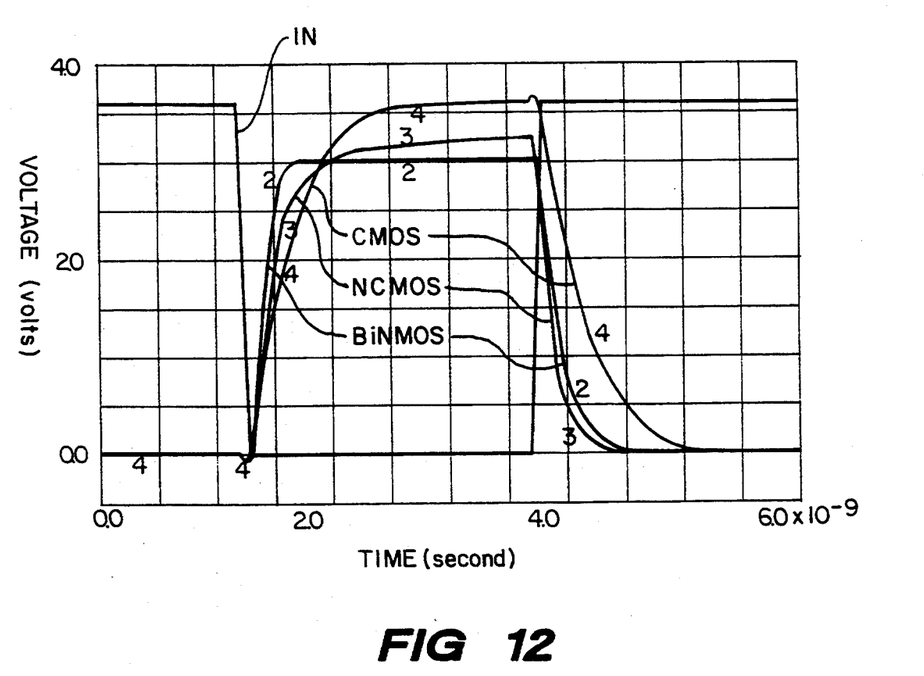
FIG. 12 depicts the voltage responses of a prior art CMOS inverter, a prior art BiNMOS inverter and an NCMOS inverter according to the invention.

The NCMOS inverter is faster than the BiNMOS inverter when the load capacitance is equal to or larger than 0.5 pico-farads. This is because the drain current, as defined by expression 1, depends on $(V_{gs}-V_t)^2$; a smaller threshold voltage leads to a higher drain current, which in turn leads to a shorter delay time. However, the threshold voltage should not be zero because that would lead to a high DC power consumption. FIG. 12 illustrates graphically the results of Table 3, with $C_L$ as 0.5 pF.

If a controlled-threshold NMOS transistor has a low threshold voltage and is used as the pull-down transistor, the circuit should be designed to remove any significant ground bounce, which may accidentally put the pull-down transistor in a conducting state.

In another preferred embodiment, all the NMOS transistors in the circuit are controlled-threshold NMOS transistors. This embodiment is particularly well suited for applications in which spurious signals and ground bounce do not pose a significant problem. However, a controlled threshold transistor may have a higher leakage current than a conventional NMOS transistor, and this should be taken into account in designing the circuit.

In another embodiment, wider gates, for example 200 to 300 microns, are used in the pull-up and pull-down transistors. Transistors with wider gates can carry more drain current and hence are suitable for driving loads that draw relatively large amounts of current. This embodiment is therefore referred to as a driver circuit.

Figure 13:
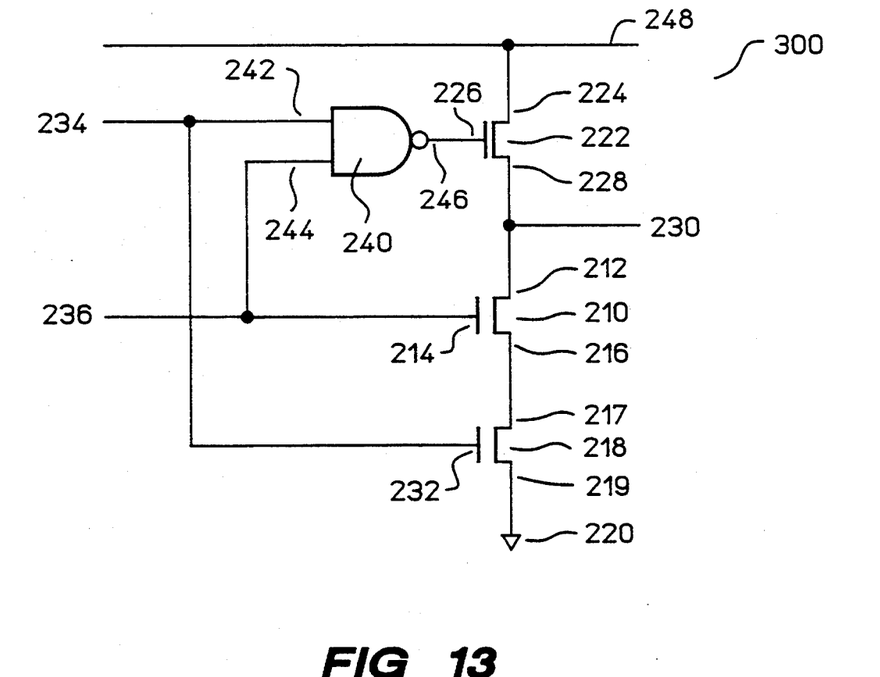
FIG. 13 shows an NCMOS NAND circuit according to the invention.

The principles of the invention may be used in many logic circuits. For example, a logic circuit embodying the principles of the invention to perform a logical NAND operation is illustrated in FIG. 13. The circuit 300 consists of three NMOS transistors and an NAND gate. The first NMOS transistor 222, a controlled-threshold NMOS transistor, responds to a first signal to establish a low-resistance current path between a first power terminal 248 and a circuit output 230 if the first signal is at a high logic level. The first NMOS transistor 222 establishs a high-resistance current path between the first power terminal and the circuit output 230 if the first signal is at a low signal.

The second NMOS transistor 210 responds to a second signal 236 to establish a low-resistance current path between the circuit output 230 and a first node if the second signal 236 is at the high logic level, and to establish a high-resistance current path between the circuit output 230 and the first node if the second signal is at the low logic level.

The third NMOS transistor 218 responds to a third signal 234 to establish a low-resistance current path between the first node and a second power terminal 220 if the third signal 234 is at the high logic level, and to establish a high-resistance current path between the first node and the second power terminal 220 if the third signal is at the low logic level.

The NAND gate 240 performs an NAND operation on the second signal 236 and the third signal 234 to produce the first signal at its output 246 such that the logic level at the circuit output 230 is the NAND logic of the second and the third signal. It will be apparent that other circuit elements can easily be arranged to provide the equivalent logical operations as the NAND gate 240.

The current flowing in the high resistance current path established by each of the transistor does not exceed a characteristic leakage current of that transistor.

A different preferred embodiment is that the second and the third NMOS transistor 210 and 218 are controlled-threshold NMOS transistors.

Although the NAND circuit shown in FIG. 13 has only two inputs, the invented circuit is not restricted to be used for NAND circuits with dual inputs.

Figure 14:
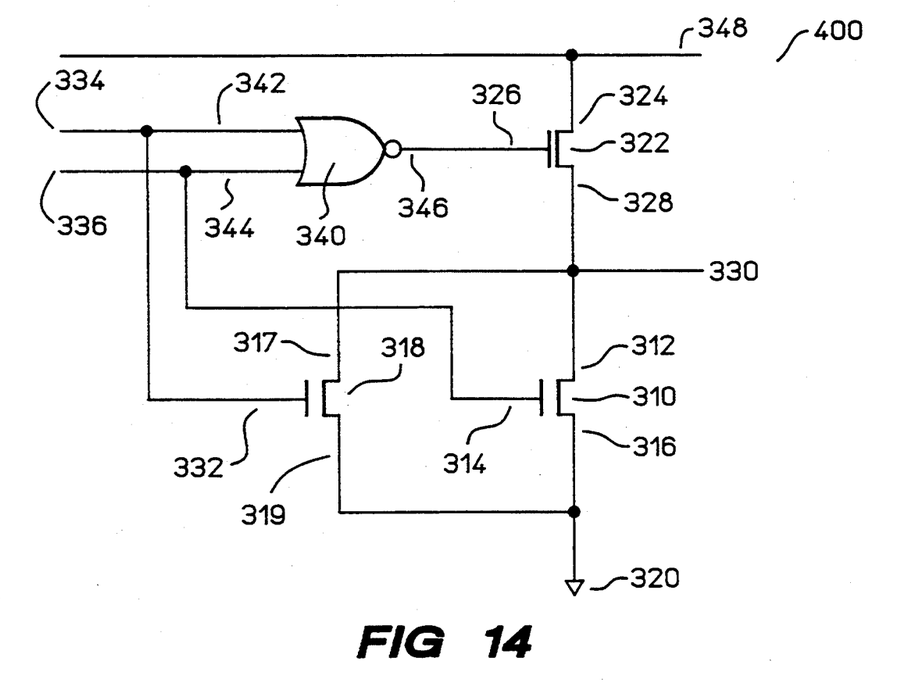
FIG. 14 shows an NCMOS NOR circuit according to the invention.

FIG. 14 shows an NCMOS circuit embodying the principles of the invention to perform an NOR operation. The circuit 400 consists of three NMOS transistors and an NOR gate. The first NMOS transistor 322, a controlled-threshold voltage transistor, responds to a first signal to establish a low-resistance current path between a first power terminal 348 and a circuit output 330 if the first signal is at a high logic level. If the first signal is at a low logic level, the first transistor 322 establishs a high-resistance current path between the first power terminal 348 and the circuit output 330.

The second NMOS transistor 318 responds to a second signal 334 to establish a low-resistance current path between a second power terminal 320 and the output 330 if the second signal is at the high logic level. The second NMOS transistor 318 establishs a high-resistance current path between the second power terminal 320 and the circuit output 330 if the second signal is at the low logic level.

The third NMOS transistor 310 responds to a third signal 336 to establish a low-resistance current path between the second power terminal 320 and the circuit output 330 if the third signal 336 is at the high logic level. The third transistor 310 establishs a high-resistance current path between the second power terminal 320 and the circuit output 330 if the third signal 336 is at the low logic level.

The NOR gate 340 performs an NOR operation on the second signal 334 and the third signal 336 to produce the first signal at its output such that the logic level at the circuit output is the NOR logic of the second and the third signal. It will be apparent that other circuit elements can easily be arranged to provide the equivalent logical operations as the NOR gate 340.

The current flowing in the high resistance current path established by each of the transistor does not exceed a characteristic leakage current of that transistor.

Preferably, the second 310 and the third 318 NMOS transistor shown in FIG. 14 are controlled-threshold NMOS transistors.

Although the NOR circuit shown in FIG. 14 has only two inputs, the invented circuit is not restricted to be used for NOR circuits with dual inputs.

Figure 15A:
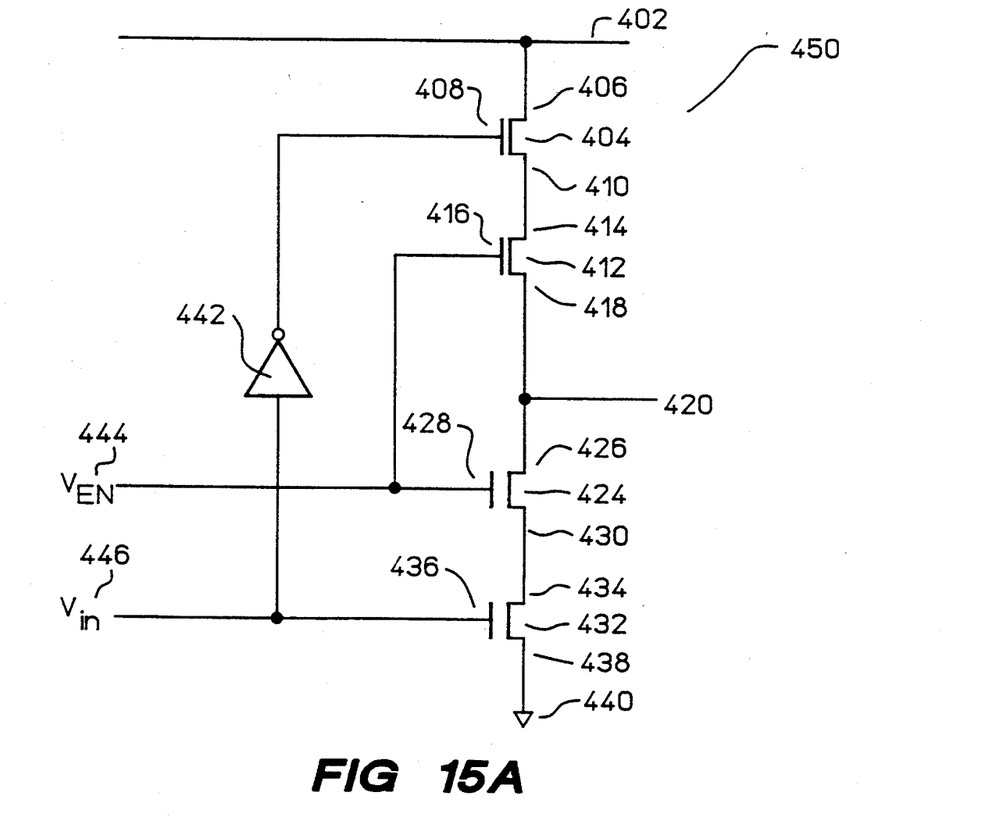
FIGS. 15A-B show two different embodiments of NCMOS tri-state logic circuits according to the invention.

FIG. 15A shows an NCMOS tri-state logic circuit embodying the principles of the invention. The circuit has four NMOS transistors and an inverter. The first NMOS transistor 412, a controlled-threshold NMOS transistor, responds to an enable signal 444 to establish a high-resistance current path between a first power terminal 402 and a circuit output 420 if the enable signal 444 is at the low logic level.

The second NMOS transistor 424 responds to enable signal 444 to establish a high-resistance current path between a second power terminal 440 and the circuit output 420 if the enable signal is at the low logic level such that the circuit output 420 assumes a high impedance state when the enable signal is at the low logic level.

The third NMOS transistor 404, a controlled-threshold NMOS transistor, responds to a first signal to establish a low-resistance current path between the first power terminal 402 and the first NMOS transistor 412 if the first signal is at a high logic level. The third NMOS transistor 404 establishs a high-resistance current path between the first power terminal 402 and the first NMOS transistor 412 if the first signal is at the low logic level.

The fourth NMOS transistor 432 responds to a second signal 446 to establish a low-resistance current path between the second power terminal 440 and the second NMOS transistor 424 if the second signal 446 is at the high logic level. The fourth transistor 432 establishs a high-resistance current path between the second power terminal 440 and the second NMOS transistor 424 if the second signal is at the low logic level.

The inverter 442 receives the second signal 446 to produce the first signal such that the enable signal 444 overrides the first and the second signal 446 and causes the circuit output 420 to assume the high impedance state when the enable signal 444 is at the low logic level.

Although the third 404 and the fourth 432 transistor with the inverter 442 are included in the circuit 450, it will be apparent that other gates can be used to couple the first 412 and second 424 transistor to the first 402 and the second 440 power terminals.

The current flowing in the high resistance current path established by each of the transistor does not exceed a characteristic leakage current of that transistor.

Preferably, the second and the fourth NMOS transistor in the NCMOS tri-state logic circuit are controlled-threshold NMOS transistors.

Figure 15B:
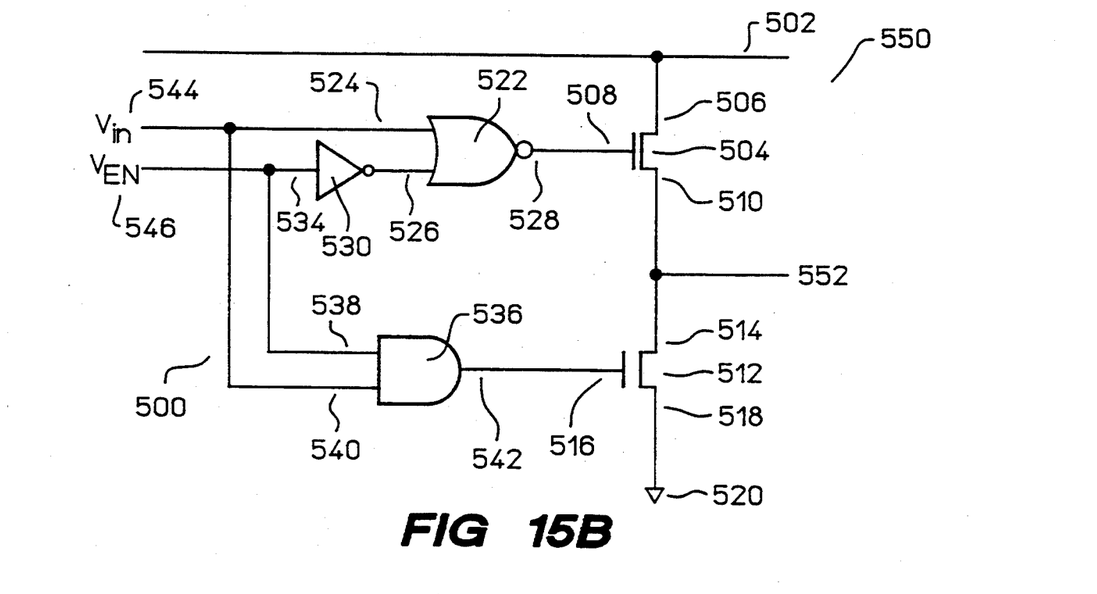

FIG. 15B shows a different tri-state logic circuit embodying the principles of the invention. A circuit 550 includes NCMOS output transistors 504 and 512 which are similar to the transistors 102 and 104, respectively, shown in FIG. 8. An input logic circuit generally 500 is responsive to a low logic level of an enable signal 546 to place the output 552 in a high-impedance state by causing both NMOS transistors 504 and 512 to establish high-resistance current paths between the circuit output 552 and both power terminals 502 and 520.

Preferably the input logic circuit 500 includes first logic means 536 for performing a logical AND operation on the first signal and the enable signal, and second logic means for performing a logical AND operation on the second signal and the enable signal. In the circuit as illustrated, the second logic means is provided by an inverter 530 that receives the enable signal and provides an inverted version of the enable signal and an NOR circuit 522 that receives the first signal and the inverted version of the enable signal. It will be apparent that other circuit elements can easily be arranged to provide equivalent logical operations as the first and the second logic means.

The current flowing in the high resistance current path established by each of the transistor does not exceed a characteristic leakage current of that transistor.

Preferably, the second NMOS transistor 512 is a controlled-threshold NMOS transistor.

Another preferred embodiment is to use a controlled-threshold NMOS transistor in an And-Or-Invert (AOI) gate.

A different preferred embodiment is to use a controlled-threshold NMOS transistor in an Or-And-Invert (OAI) gate.

The present invention is a family of new high performance logic circuits using NMOS transistors characterized by controlled threshold voltages. Compared to CMOS circuits, the invented circuits are faster. Compared to BiNMOS and BiCMOS circuits, the invented circuits are more reliable, lower cost, easier to design and, in certain instances, even faster. Moreover, the invented circuit can be scaled with the value of the supply voltage.

Although a specific embodiment of the invention has been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

I claim:
1. A circuit comprising:
 a first NMOS transistor characterized by a controlled threshold voltage not equal to zero volt, and responsive to a first signal to establish a low-resistance current path between a first power terminal and a circuit output if the first signal assumes a high logic level, and to establish a high-resistance current path between the first power terminal and the circuit output if the first signal assumes a low logic level;
 a second NMOS transistor with a threshold voltage and responsive to a second signal to establish a low-resistance current path between a second power terminal and the circuit output if the second signal assumes the high logic level, and to establish a high-resistance current path between the second power terminal and the circuit output if the second signal assumes the low logic level; and
 ratioless-logic means for causing the first and second signals to assume opposite logic levels;
 such that
  the threshold voltage of at least the first NMOS transistor is controlled to be lower than the threshold voltage of at least one other NMOS transistor; and
  the circuit is a ratioless logic circuit;
 whereby a low-resistance current path is established between the circuit output and the first power terminal when the first signal assumes the high logic level and between the circuit output and the second power terminal when the first signal assumes the low logic level.

2. A circuit as recited in claim 1 wherein the second NMOS transistor is characterized by a controlled threshold voltage.

3. A circuit as recited in claim 1, wherein any current flowing through the high-resistance current path established by each transistor does not exceed the characteristic leakage current of that transistor.

4. A circuit as recited in claim 1 wherein the means for causing is an inverter responsive to the first signal to produce the second signal such that, with the first power terminal at the high logic level and the second power terminal at the low logic level, the circuit performs an inverting operation on the first signal.

5. A circuit as recited in claim 4, wherein any current flowing through the high-resistance current path established by each transistor does not exceed a characteristic leakage current of that transistor.

6. An oscillator comprising three capacitors and three circuits of the kind described in claim 4, the three circuits connected in a serial ring, and a capacitor connected between the output of each circuit and a ground.

7. A circuit as recited in claim 4 wherein the second NMOS transistor is characterized by a controlled threshold voltage.

8. A circuit comprising:
a first NMOS transistor characterized by a controlled threshold voltage not equal to zero volt, and responsive to a first signal to establish a low-resistance current path between a first power terminal and a circuit output if the first signal assumes a high logic level, and to establish a high-resistance current path between the first power terminal and the circuit output if the first signal assumes a low logic level;
a second NMOS transistor with a threshold voltage and responsive to a second signal to establish a low-resistance current path between a second power terminal and the circuit output if the second signal assumes the high logic level, and to establish a high-resistance current path between the second power terminal and the circuit output if the second signal assumes the low logic level; and
an input ratioless-logic circuit responsive to an enable signal to place the circuit output in a high-impedance state by causing the NMOS transistors to establish high-resistance current paths between the circuit output and both power terminals, both the first and the second signals depending on the enable signal;
such that
the threshold voltage of at least the first NMOS transistor is controlled to be lower than the threshold voltage of at least one other NMOS transistor; and
the circuit is a ratioless logic circuit.

9. A circuit as in claim 8 wherein the input logic circuit comprises:
first logic means for performing a logical AND operation on an input signal and the enable signal to produce the second signal; and
second logic means for performing a logical AND operation on the enable signal and the opposite logic level of the input signal to produce the first signal.

10. A circuit as in claim 9 wherein the second logic means comprises:
an inverter gate that receives the enable signal and provides an inverted version of the enable signal; and
an NOR gate that receives the input signal and the inverted version of the enable signal.

11. A circuit comprising:
a first NMOS transistor characterized by a controlled threshold voltage not equal to zero volt, and responsive to a first signal to establish a low-resistance current path between a first power terminal and a circuit output if the first signal is at a high logic level, and to establish a high-resistance current path between the first power terminal and the circuit output if the first signal is at a low logic level;
a second NMOS transistor with a threshold voltage and responsive to a second signal to establish a low-resistance current path between the circuit output and a first node if the second signal is at the high logic level, and to establish a high-resistance current path between the circuit output and the first node if the second signal is at the low logic level;
a third NMOS transistor with a threshold voltage and responsive to a third signal to establish a low-resistance current path between the first node and a second power terminal if the third signal is at the high logic level, and to establish a high-resistance current path between the first node and the second power terminal if the third signal is at the low logic level; and
ratioless-logic means performing an NAND operation on the second and the third signal to produce the first signal;
such that
the threshold voltage of at least the first NMOS transistor is controlled to be lower than the threshold voltage of at least one other NMOS transistor,
the logic level at the circuit output is the NAND logic of the second and the third signal, and
the circuit is a ratioless logic circuit.

12. A circuit as recited in claim 11 wherein the current flowing through the high resistance current path established by each transistor does not exceed a characteristic leakage current of that transistor.

13. A circuit as recited in claim 11 wherein the logic means is an NAND gate.

14. A circuit comprising:
a first NMOS transistor characterized by a controlled threshold voltage not equal to zero volt, and responsive to a first signal to establish a low-resistance current path between a first power terminal and a circuit output if the first signal is at a high logic level, and to establish a high-resistance current path between the first power terminal and the circuit output if the first signal is at a low logic level;
a second NMOS transistor with a threshold voltage and responsive to a second signal to establish a low-resistance current path between a second power terminal and the circuit output if the second signal is at the high logic level, and to establish a high-resistance current path between the second power terminal and the circuit output if the second signal is at the low logic level;
a third NMOS transistor with a threshold voltage and responsive to a third signal to establish a low-resistance current path between the second power terminal and the circuit output if the third signal is at the high logic level, and to establish a high-resistance current path between the second power terminal and the circuit output if the third signal is at the low logic level; and ratioless-logic means performing an NOR operation on the second and the third signal to produce the first signal;

such that the threshold voltage of at least the first NMOS transistor is controlled to be lower than the threshold voltage of at least one other NMOS transistor, the logic level at the circuit output is the NOR logic of the second and the third signal, and the circuit is a ratioless logic circuit.

15. A circuit as recited in claim 14, wherein the logic means is an NOR gate.

16. A circuit as recited in claim 14 wherein the second and the third NMOS transistor are each characterized by a controlled threshold voltage.

17. A circuit comprising:

a first NMOS transistor characterized by a controlled threshold voltage not equal to zero volt, and responsive to an enable signal to establish a high-resistance current path between a first power terminal and a circuit output if the enable signal is at a low logic level;

a second NMOS transistor with a threshold voltage and responsive to the enable signal to establish a high-resistance current path between a second power terminal and the circuit output if the enable signal is at the low logic level;

a third NMOS transistor characterized by a controlled threshold voltage and responsive to a first signal to establish a low-resistance current path between the first power terminal and the first NMOS transistor if the first signal is at a high logic level, and to establish a high-resistance current path between the first power terminal and the first NMOS transistor if the first signal is at the low logic level;

a fourth NMOS transistor responsive to a second signal to establish a low-resistance current path between the second power terminal and the second NMOS transistor if the second signal is at the high logic level, and to establish a high-resistance current path between the second power terminal and the second NMOS transistor if the second signal is at the low logic level; and ratioless-logic means for causing the first and the second signal to assume opposite logic levels;

such that the enable signal overrides the first and the second signal and causes the circuit output to assume the high impedance state when the enable signal is at the low logic level;

the threshold voltage of at least the first NMOS transistor is controlled to be lower than the threshold voltage of at least one other NMOS transistor;

the circuit output assumes a high impedance state when the enable signal is at the low logic level; and the circuit is a ratioless logic circuit.

18. A circuit as recited in claim 17, wherein any current flowing through the high-resistance current path established by each transistor does not exceed a characteristic leakage current of that transistor.

19. A circuit as recited in claim 17 wherein the second and the fourth NMOS transistor are each characterized by a controlled threshold voltage.

20. A circuit as recited in claim 1, wherein the threshold voltage of the first NMOS transistor is controlled to be approximately 0.2 Volts.

* * * * *